(12) United States Patent
Komine et al.

(10) Patent No.: US 8,343,692 B2
(45) Date of Patent: Jan. 1, 2013

(54) EXPOSURE APPARATUS INSPECTION MASK AND EXPOSURE APPARATUS INSPECTION METHOD

(75) Inventors: Nobuhiro Komine, Mie-ken (JP); Kazuya Fukuhara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 253 days.

(21) Appl. No.: 12/886,157

(22) Filed: Sep. 20, 2010

(65) Prior Publication Data

US 2011/0300472 A1 Dec. 8, 2011

(30) Foreign Application Priority Data

Jun. 2, 2010 (JP) ................................. 2010-126698

(51) Int. Cl.
*G03F 1/38* (2012.01)
(52) U.S. Cl. .......................................... 430/5; 430/319
(58) Field of Classification Search ................ 430/5, 319
See application file for complete search history.

(56) References Cited

U.S. PATENT DOCUMENTS

| 6,674,511 | B2 | 1/2004 | Nomura et al. |
| 2009/0190118 | A1 | 7/2009 | Fukuhara |

FOREIGN PATENT DOCUMENTS

| JP | 2004-29372 | 1/2004 |
| JP | 2009-175587 | 8/2009 |
| KR | 10-2010-0002553 | 1/2010 |

OTHER PUBLICATIONS

Notification of Comments issued by the Korean Patent Office on Aug. 31, 2011, for Korean Patent Application No. 10-2010-88245, and English-language translation thereof.

*Primary Examiner* — Christopher Young
(74) *Attorney, Agent, or Firm* — Finnegan, Henderson, Farabow, Garrett & Dunner, L.L.P.

(57) ABSTRACT

According to one embodiment, an exposure apparatus inspection mask includes a substrate and a first pattern portion. The substrate has a major surface reflective to exposure light. The first pattern portion is provided on the major surface. The first pattern portion includes a first lower layer and a plurality of first reflection layers. The first lower layer is provided on the major surface and includes a plurality of first absorption layers periodically arranged at a prescribed pitch along a first direction parallel to the major surface and is absorptive to the exposure light. The plurality of first reflection layers are provided on a side of the first lower layer opposite to the substrate, are periodically arranged at the pitch along the first direction, expose at least part of each of the plurality of first absorption layers, and have higher reflectance for the exposure light than the first absorption layers.

18 Claims, 8 Drawing Sheets

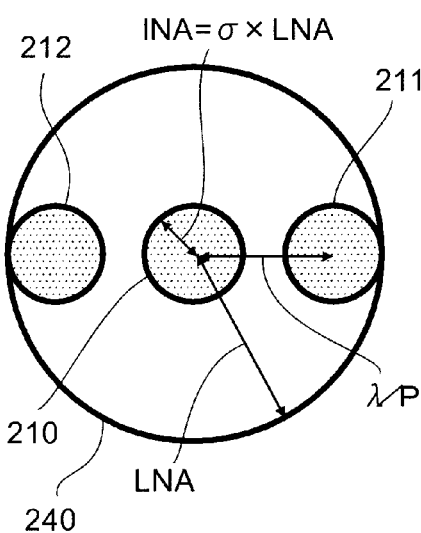 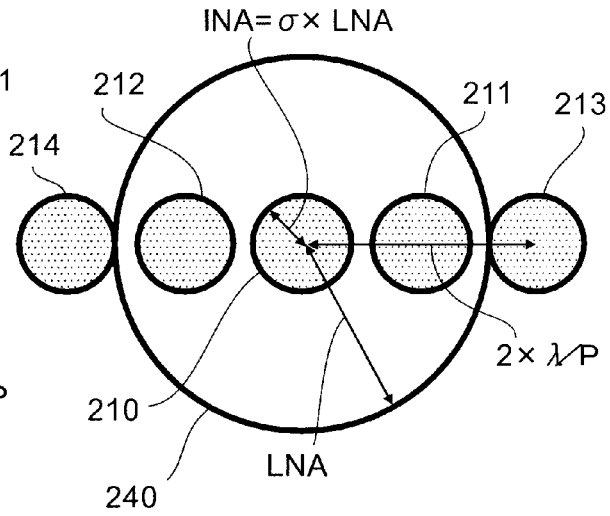
FIG. 5A  FIG. 5B
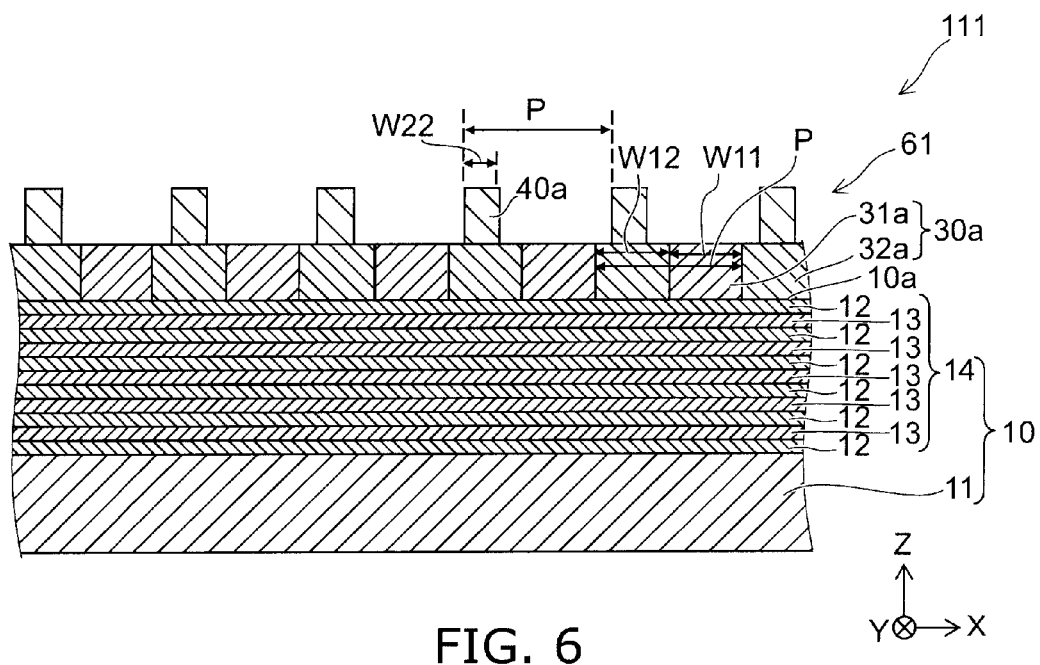
FIG. 6

EXPOSURE APPARATUS INSPECTION MASK AND EXPOSURE APPARATUS INSPECTION METHOD

CROSS-REFERENCE TO RELATED APPLICATIONS

This application is based upon and claims the benefit of priority from the prior Japanese Patent Application No. 2010-126698, filed on Jun. 2, 2010; the entire contents of which are incorporated herein by reference.

FIELD

Embodiments described herein relate generally to an exposure apparatus inspection mask and an exposure apparatus inspection method.

BACKGROUND

With the miniaturization of semiconductor devices, the exposure light of the exposure apparatus used to manufacture semiconductor devices has been shifted to shorter wavelengths. For example, there are expectations for practical application of the exposure technique using extreme ultraviolet (EUV) light having a wavelength of 13.5 nanometers (nm). In such exposure using EUV light, transmissive lenses cannot be used because of the high absorption coefficient of the substance. Instead, a reflective optical system using mirrors is used. Thus, in exposure using EUV light, a reflection type photomask is used.

The development of a special technology for evaluating the performance of an exposure apparatus using a reflection type photomask is necessary.

BRIEF DESCRIPTION OF THE DRAWINGS

FIG. 5A and FIG. 5B are schematic views illustrating characteristics of the exposure apparatus inspection mask according to the first embodiment;

FIG. 6 is a schematic cross-sectional view illustrating the configuration of an alternative exposure apparatus inspection mask according to the first embodiment;

DETAILED DESCRIPTION

Figure 1:
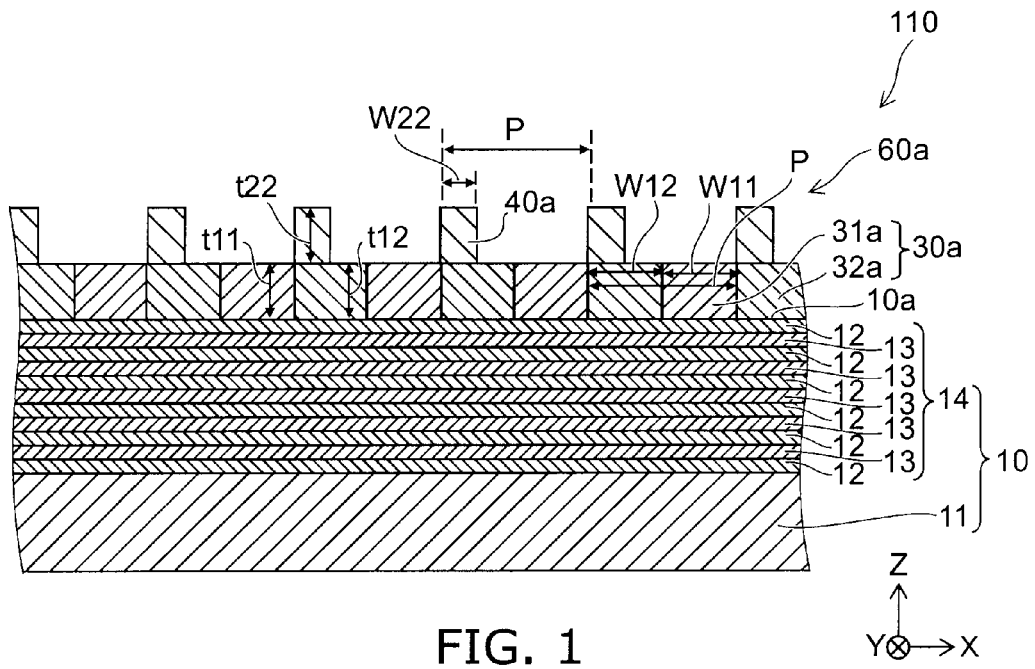
FIG. 1 is a schematic cross-sectional view illustrating the configuration of an exposure apparatus inspection mask according to a first embodiment.

In general, according to one embodiment, an exposure apparatus inspection mask includes a substrate and a first pattern portion. The substrate has a major surface reflective to exposure light. The first pattern portion is provided on the major surface. The first pattern portion includes a first lower layer and a plurality of first reflection layers. The first lower layer is provided on the major surface and includes a plurality of first absorption layers periodically arranged at a prescribed pitch along a first direction parallel to the major surface and is absorptive to the exposure light. The plurality of first reflection layers are provided on a side of the first lower layer opposite to the substrate. The plurality of first reflection layers are periodically arranged at the pitch along the first direction, expose at least part of each of the plurality of first absorption layers, and have a reflectance for the exposure light higher than a reflectance for the exposure light of the first absorption layers.

According to another embodiment, an exposure apparatus inspection method is disclosed. The method can form a resist layer by irradiating a resist film formed on an inspection wafer with an exposure light reflected by an exposure apparatus inspection mask, the resist layer having a pattern based on a pattern of the exposure apparatus inspection mask. The method can measure a position of the pattern of the resist layer. The exposure apparatus inspection mask includes a substrate and a first pattern portion. The substrate has a major surface reflective to the exposure light. The first pattern portion is provided on the major surface. The first pattern portion includes a first lower layer and a plurality of first reflection layers. The first lower layer is provided on the major surface and includes a plurality of first absorption layers periodically arranged at a prescribed pitch along a first direction parallel to the major surface and being absorptive to the exposure light. The plurality of first reflection layers are provided on a side of the first lower layer opposite to the substrate. The plurality of first reflection layers are periodically arranged at the pitch along the first direction, expose at least part of each of the plurality of first absorption layers, and have a reflectance for the exposure light higher than a reflectance for the exposure light of the first absorption layers.

Embodiments of the invention will now be described with reference to the drawings.

The drawings are schematic or conceptual. The relationship between the thickness and the width of each portion, and the size ratio between the portions, for example, are not necessarily identical to those in reality. Furthermore, the same portion may be shown with different dimensions or ratios depending on the figures.

In the present specification of the application and the drawings, the same components as those described previously with reference to earlier figures are labeled with like reference numerals, and the detailed description thereof is omitted as appropriate.

(First Embodiment)

FIG. 1 is a schematic cross-sectional view illustrating the configuration of an exposure apparatus inspection mask according to a first embodiment.

The exposure apparatus inspection mask 110 according to this embodiment is an exposure apparatus inspection mask used to inspect an exposure apparatus using a reflection type photomask. The exposure apparatus to be inspected is illustratively an exposure apparatus using EUV light having a wavelength of 13.5 nm as exposure light.

As described below, the exposure apparatus inspection mask 110 generates plus first order diffraction light and minus first order diffraction light. The plus first order diffraction light and the minus first order diffraction light are mutually different in diffraction efficiency.

As shown in FIG. 1, the exposure apparatus inspection mask 110 according to this embodiment includes a substrate 10 and a first pattern portion 60a.

The substrate 10 includes a major surface 10a reflective to exposure light (e.g., EUV light) used in the exposure apparatus.

In this example, the substrate 10 includes a base 11 and a stacked film 14. The stacked film 14 is provided on the base 11. The stacked film 14 includes a plurality of first layers 12 and second layers 13. The first layers 12 are stacked in a stacking direction perpendicular to the major surface 10a. The second layer 13 is provided between the plurality of first layers 12. The optical characteristic for the exposure light of the first layer 12 is different from the optical characteristic for the exposure light of the second layer 13. The optical characteristic for the exposure light includes at least one of refractive index for the exposure light, reflectance for the exposure light, and absorptance for the exposure light. For example, the first layer 12 includes silicon (Si), and the second layer 13 includes molybdenum (Mo).

Thus, the substrate 10 can include a plurality of first layers 12 and second layers 13. The first layers 12 are stacked on the major surface 10a in the stacking direction perpendicular to the major surface 10a. The second layer 13 is provided between the plurality of first layers 12 and has a different optical characteristic for the exposure light from the first layer 12. This allows the major surface 10a to be reflective to the exposure light. In this example, six first layers 12 and five second layers 13 are provided. However, the number of first layers 12 and the number of second layers 13 are arbitrary.

Here, a direction perpendicular to the major surface 10a is defined as a Z-axis direction. One direction perpendicular to the Z-axis direction is defined as an X-axis direction. A direction perpendicular to the Z-axis direction and the X-axis direction is defined as a Y-axis direction.

The term "stacked" used herein refers not only to the case where a plurality of layers are directly piled up, but also to the case where a plurality of layers are piled up with other components interposed therebetween.

The first pattern portion 60a includes a first lower layer 30a and a plurality of first reflection layers 40a.

The first lower layer 30a is provided on the major surface 10a of the substrate 10. The first lower layer 30a includes a plurality of first absorption layers 31a. The plurality of first absorption layers 31a are periodically arranged at a prescribed pitch P along a first direction parallel to the major surface 10a. The first absorption layer 31a is absorptive to the exposure light.

In this example, the first lower layer 30a further includes a first lower reflection layer 32a provided between the plurality of first absorption layers 31a and having higher reflectance for the exposure light than the first absorption layer 31a. As described below, the first lower reflection layer 32a is provided as necessary, and can be omitted in some cases.

The plurality of first reflection layers 40a are provided on the opposite side of the first lower layer 30a from the substrate 10. For example, the plurality of first reflection layers 40a are provided on the first lower layer 30a. The plurality of first reflection layers 40a are periodically arranged at the pitch P along the aforementioned first direction. Each of the plurality of first reflection layers 40a exposes at least part of each of the plurality of first absorption layers 31a. The reflectance for the exposure light of the plurality of first reflection layers 40a is higher than the reflectance for the exposure light of the first absorption layer 31a.

In the following description, it is assumed that the first direction is the X-axis direction. Furthermore, it is assumed that a second direction parallel to the major surface 10a and perpendicular to the first direction (X-axis direction) is the Y-axis direction.

Each of the plurality of first absorption layers 31a can have, for example, a strip-like pattern shape aligned along the Y-axis direction. The width W11 (width along the X-axis direction) of each of the plurality of first absorption layers 31a can be set to substantially half the pitch P. That is, the width W11 along the X-axis direction of each of the plurality of first absorption layers 31a can be set substantially equal to the width W12 between the plurality of first absorption layers 31a. The total of the width W11 and the width W12 is equal to the pitch P. In this example, the width W12 between the plurality of first absorption layers 31a is substantially coincident with the width along the X-axis direction of each of a plurality of first lower reflection layers 32a.

However, the width W11 of each of the plurality of first absorption layers 31a is arbitrary. Furthermore, the width W12 between the plurality of first absorption layers 31a (in this example, the width along the X-axis direction of each of the plurality of first lower reflection layers 32a) is arbitrary.

Each of the plurality of first reflection layers 40a can have, for example, a strip-like pattern shape aligned along the Y-axis direction. The width W22 along the X-axis direction of each of the plurality of first reflection layers 40a can be set smaller than the width W11 of each of the plurality of first absorption layers 31a. The width W22 along the X-axis direction of each of the plurality of first reflection layers 40a can be set smaller than the width W12 between the plurality of first absorption layers 31a (in this example, the width along the X-axis direction of each of the plurality of first lower reflection layers 32a). Thus, at least part of each of the plurality of first absorption layers 31a is not covered with the plurality of first reflection layers 40a.

That is, on the major surface 10a side of the substrate 10, the first reflection layer 40a and at least part of the first absorption layer 31a are exposed.

In this example, the width W22 along the X-axis direction of each of the plurality of first reflection layers 40a is substantially equal to half the width W12 between the plurality of first absorption layers 31a (in this example, the width along the X-axis direction of each of the plurality of first lower reflection layers 32a).

However, the width W22 along the X-axis direction of each of the plurality of first reflection layers 40a is arbitrary.

The pitch P can be set to, for example, 80 nm. The width W11 of each of the plurality of first absorption layers 31a can be set to, for example, 40 nm. The width W12 between the plurality of first absorption layers 31a (in this example, the width along the X-axis direction of each of the plurality of first lower reflection layers 32a) can be set to, for example, 40 nm. The width W22 along the X-axis direction of each of the plurality of first reflection layers 40a can be set to, for example, 20 nm. However, as described above, the width W11, the width W12, and the width W22 are arbitrary. A preferable condition for the pitch P is described below.

The first absorption layer 31a includes, for example, a tantalum (Ta) material. The first lower reflection layer 32a includes, for example, silicon. The first reflection layer 40a includes, for example, silicon.

However, the first absorption layer 31a can include any material having higher absorptance for the exposure light than the first reflection layer 40a. The first lower reflection layer 32a can include any material having higher reflectance for the exposure light than the first absorption layer 31a. The first reflection layer 40a can include any material having higher reflectance for the exposure light than the first absorption layer 31a.

The thickness t11 (thickness along the Z-axis direction) of the first absorption layer 31a can be set to, for example, 61 nm. The thickness t12 (thickness along the Z-axis direction) of the first lower reflection layer 32a can be set substantially equal to the thickness t11 of the first absorption layer 31a. The thickness t22 (thickness along the Z-axis direction) of the first reflection layer 40a can be set to, for example, 61 nm. However, the thickness t11 of the first absorption layer 31a, the thickness t12 of the first lower reflection layer 32a, and the thickness t22 of the first reflection layer 40a are arbitrary.

The exposure apparatus inspection mask 110 thus configured generates plus first order diffraction light and minus first order diffraction light being mutually different in diffraction efficiency.

Figure 2A:
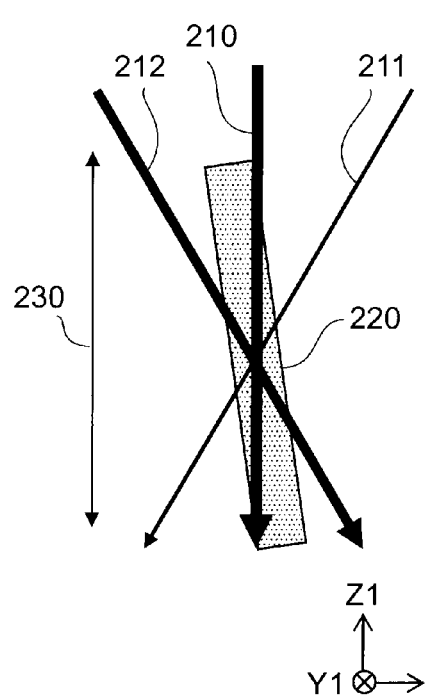
FIG. 2A and FIG. 2B are schematic views illustrating operations of the exposure apparatus inspection mask.
Figure 2B:
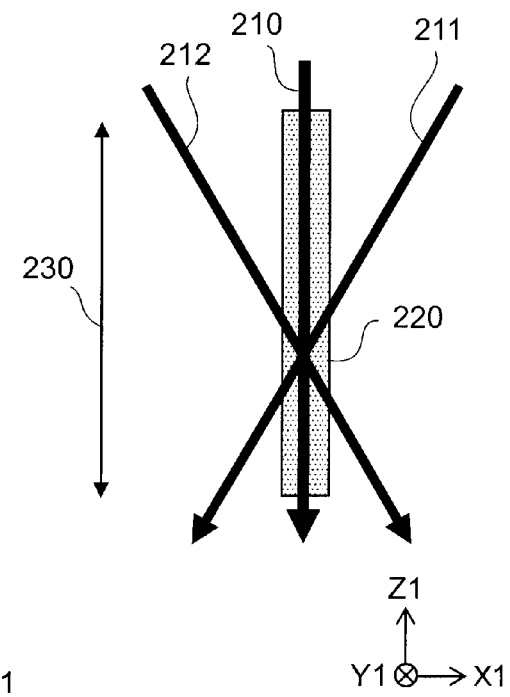

FIG. 2A and FIG. 2B are schematic views illustrating operations of the exposure apparatus inspection mask. More specifically, FIG. 2A illustrates the case where the diffraction efficiency of the exposure apparatus inspection mask is asymmetric, and FIG. 2B illustrates the case where the diffraction efficiency of the exposure apparatus inspection mask is symmetric.

Here, a direction parallel to a focus direction 230 of the exposure apparatus is defined as a Z1-axis direction. One direction perpendicular to the Z1-axis direction is defined as an X1-axis direction. A direction perpendicular to the Z1-axis direction and the X1-axis direction is defined as an Y1-axis direction.

As shown in FIG. 2B, in the case of symmetric diffraction efficiency, even if the focus position is shifted along the Z1-axis direction, a zeroth order light 210, a plus first order diffraction light 211, and a minus first order diffraction light 212 are projected at the same positions in the X1-Y1 plane on the wafer. Thus, even if the focus position is shifted along the Z1-axis direction, a pattern transfer position 220 on the wafer does not change, for example, in the X1-Y1 plane.

On the other hand, as shown in FIG. 2A, in the case of asymmetric diffraction efficiency, if the focus position is shifted along the Z1-axis direction, the plus first order diffraction light 211 and the minus first order diffraction light 212 are shifted in the X1-Y1 plane on the wafer in accordance with the shift of the focus position. Thus, if the focus position is shifted along the Z1-axis direction, the pattern transfer position 220 on the wafer is shifted, for example, in the X1-Y1 plane.

The exposure apparatus inspection mask 110 according to this embodiment includes a stacked structure of the first lower layer 30a including the first absorption layer 31a, and the first reflection layer 40a provided on the first lower layer 30a and exposing at least part of the first absorption layer 31a. Thus, in the exposure apparatus inspection mask 110, the plus first order diffraction light and the minus first order diffraction light are mutually different in diffraction efficiency. That is, the plus first order diffraction light and the minus first order diffraction light are asymmetric. Thus, as illustrated in FIG. 2A, in the case where the focus position is shifted along the Z1-axis direction, the pattern transfer position 220 on the wafer can be shifted, for example, in the X1-Y1 plane. By measuring the amount of this shift of the pattern transfer position in the X1-Y1 plane, the focus position of the exposure apparatus can be detected.

Figure 3:
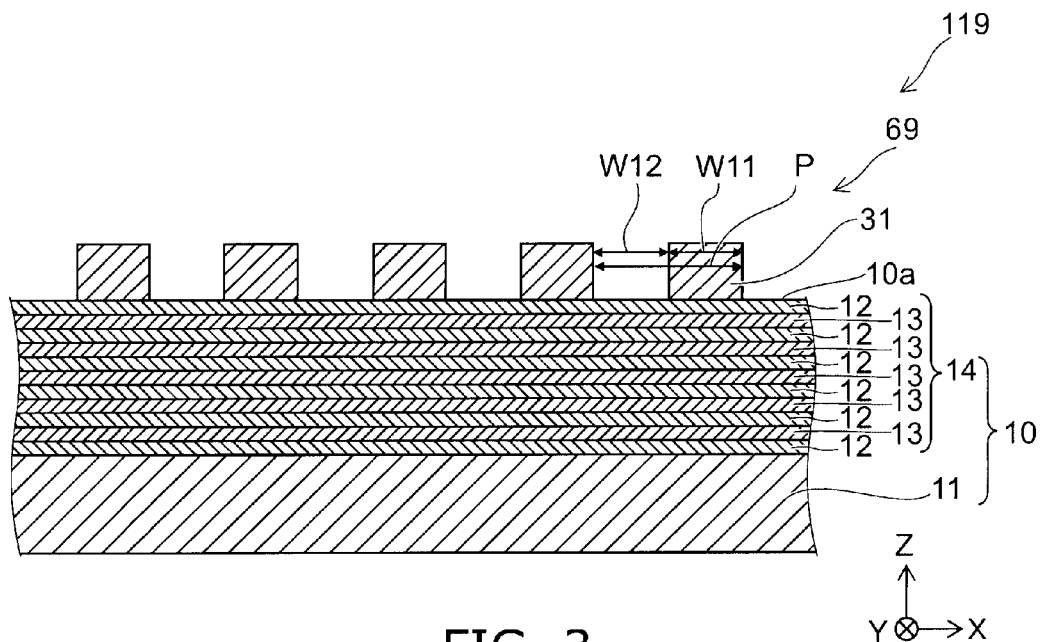
FIG. 3 is a schematic cross-sectional view illustrating the configuration of an exposure apparatus inspection mask of a comparative example.

FIG. 3 is a schematic cross-sectional view illustrating the configuration of an exposure apparatus inspection mask of a comparative example.

As shown in FIG. 3, in the exposure apparatus inspection mask 119 of the comparative example, only a plurality of absorption layers 31 are provided as a first pattern portion 69 on the major surface of a substrate 10. The plurality of absorption layers 31 are arranged at a pitch P along the X-axis direction. The width W11 of the absorption layer 31 and the width W12 between the absorption layers 31 are, for example, half the pitch P.

In the exposure apparatus inspection mask 119 of the comparative example thus configured, the plus first order diffraction light and the minus first order diffraction light are mutually identical in diffraction efficiency and are symmetric. Thus, as described with reference to FIG. 2B, even if the focus position is shifted along the Z1-axis direction, the pattern transfer position 220 on the wafer is not shifted. Hence, the focus position of the exposure apparatus cannot be detected.

In contrast, the exposure apparatus inspection mask 110 according to this embodiment is based on a stacked structure of the first lower layer 30a including the first absorption layer 31a, and the first reflection layer 40a. Thus, in the exposure apparatus inspection mask 110, the plus first order diffraction light and the minus first order diffraction light are made mutually different in diffraction efficiency. Hence, when the focus position is shifted, the pattern transfer position 220 on the wafer is shifted. Thus, the focus position of the exposure apparatus can be detected. That is, by using the exposure apparatus inspection mask 110, the focus characteristic (e.g., focus accuracy) of an exposure apparatus using a reflection type photomask can be inspected.

In the following, an example of the preferable condition for the pitch P in the exposure apparatus inspection mask 110 according to this embodiment will be described.

Figure 4:
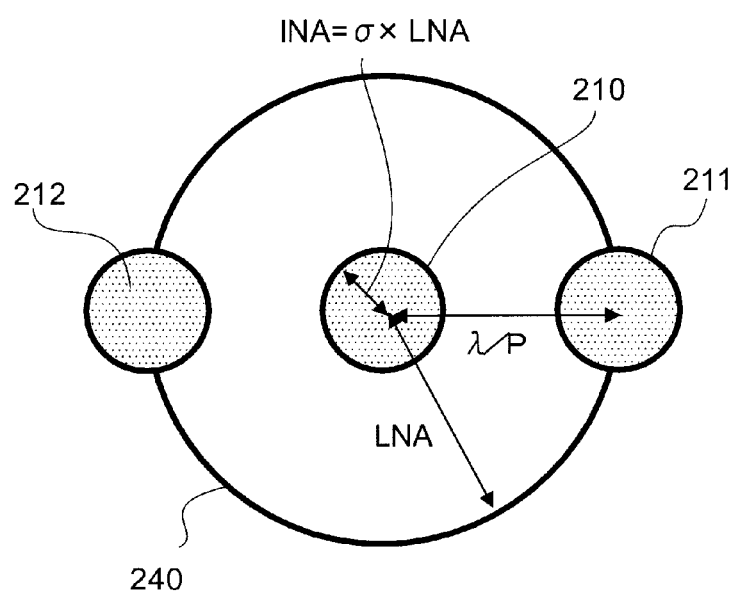
FIG. 4 is a schematic view illustrating characteristics of the exposure apparatus inspection mask according to the first embodiment.

FIG. 4 is a schematic view illustrating characteristics of the exposure apparatus inspection mask according to the first embodiment. More specifically, FIG. 4 schematically illustrates the relationship between the numerical aperture NA of the projection optical system and the projection range of the diffraction light.

Here, it is assumed as follows. The wavelength of the exposure light of the exposure apparatus is wavelength $\lambda$. The numerical aperture of the illumination optical system of the exposure apparatus is illumination optical system numerical aperture INA. The numerical aperture of the projection optical system of the exposure apparatus is projection optical system numerical aperture LNA. The ratio of the numerical aperture of the illumination optical system to the numerical aperture of the projection optical system is numerical aperture ratio $\sigma$. That is, $\sigma$=INA/LNA.

As shown in FIG. 4, in the inspection using the exposure apparatus inspection mask 110, it is only necessary that at least part of the first order diffraction light (at least part of the plus first order diffraction light 211 and at least part of the minus first order diffraction light 212) is projected in the range 240 of the projection optical system numerical aperture LNA.

Thus, it is only necessary to satisfy the following relation (1).

$$\frac{\lambda}{P} - INA \le LNA \quad (1)$$

That is, it is only necessary to satisfy the following relation (2).

$$P \ge \lambda/\{LNA\times(1+\sigma)\} \quad (2)$$

Thus, the pitch P is set to $\lambda/\{LNA\times(1+\sigma)\}$ or more.

FIG. 5A and FIG. 5B are schematic views illustrating characteristics of the exposure apparatus inspection mask according to the first embodiment.

More specifically, FIG. 5A and FIG. 5B illustrate characteristics more preferable than that illustrated in FIG. 4.

As shown in FIG. 5A, more preferably, all the first order diffraction light (all the plus first order diffraction light 211 and all the minus first order diffraction light 212) is projected in the range 240 of the projection optical system numerical aperture LNA.

Furthermore, as shown in FIG. 5B, more preferably, the second order diffraction light (the plus second order diffraction light 213 and the minus second order diffraction light 214) is not projected in the range 240 of the projection optical system numerical aperture LNA.

Thus, it is more preferable to satisfy the following relation (3).

$$\frac{\lambda}{LNA\times(1-\sigma)} \le P \le \frac{2\lambda}{LNA\times(1+\sigma)} \quad (3)$$

That is, more preferably, the pitch P is not less than $\lambda/\{LNA\times(1-\sigma)\}$ and not more than $2\times\lambda/\{LNA\times(1+\sigma)\}$. Accordingly, all the first order diffraction light is projected in the range 240 of the projection optical system numerical aperture LNA, while the second order diffraction light is not projected in the range 240. This further improves the accuracy of pattern transfer on the wafer, and further improves the detection accuracy for the focus position of the exposure apparatus.

In the case where the exposure wavelength λ is 13.5 nm, the projection optical system numerical aperture LNA is 0.25, and the numerical aperture ratio σ is 0.10, if the pitch P is set to 80 nm, then the above first, second, and third relations are satisfied.

FIG. 6 is a schematic cross-sectional view illustrating the configuration of an alternative exposure apparatus inspection mask according to the first embodiment.

As shown in FIG. 6, the alternative exposure apparatus inspection mask 111 according to this embodiment also includes a substrate 10 and a first pattern portion 61. The first pattern portion 61 includes a first lower layer 30a including a first absorption layer 31a and a first lower reflection layer 32a, and a first reflection layer 40a provided on the opposite side of the first lower layer 30a from the substrate 10.

In this example, the position along the X-axis direction of each first reflection layer 40a is located at the center along the X-axis direction of each first lower reflection layer 32a. On the other hand, in the exposure apparatus inspection mask 110 illustrated in FIG. 1, the position along the X-axis direction of each first reflection layer 40a is located at the end along the X-axis direction of each first lower reflection layer 32a. Thus, the position along the X-axis direction of each first reflection layer 40a is arbitrary.

Figure 7:
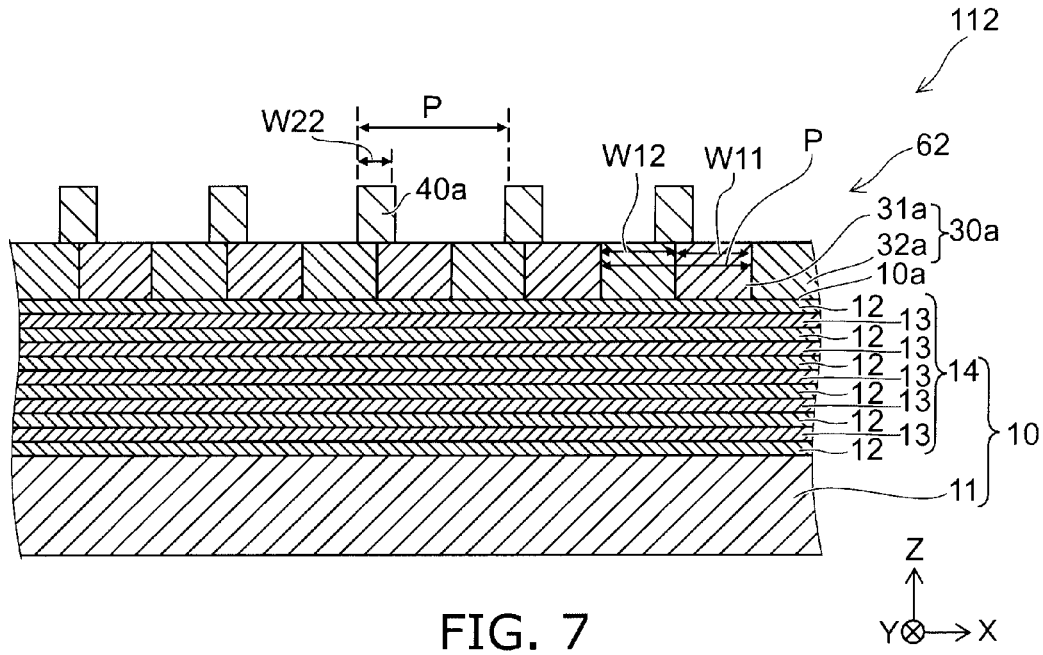
FIG. 7 is a schematic cross-sectional view illustrating the configuration of an alternative exposure apparatus inspection mask according to the first embodiment.

FIG. 7 is a schematic cross-sectional view illustrating the configuration of an alternative exposure apparatus inspection mask according to the first embodiment.

As shown in FIG. 7, the alternative exposure apparatus inspection mask 112 according to this embodiment also includes a substrate 10 and a first pattern portion 62. The first pattern portion 62 includes a first lower layer 30a including a first absorption layer 31a and a first lower reflection layer 32a, and a first reflection layer 40a.

In this example, each first reflection layer 40a is provided on the boundary between the first lower reflection layer 32a and the first absorption layer 31a. That is, each first reflection layer 40a is provided on the first lower reflection layer 32a and the first absorption layer 31a being adjacent to each other. Thus, the first reflection layer 40a may be provided only on the first lower reflection layer 32a (e.g., the exposure apparatus inspection masks 110 and 111), or may be provided on both the first lower reflection layer 32a and the first absorption layer 31a (e.g., the exposure apparatus inspection mask 112).

Figure 8:
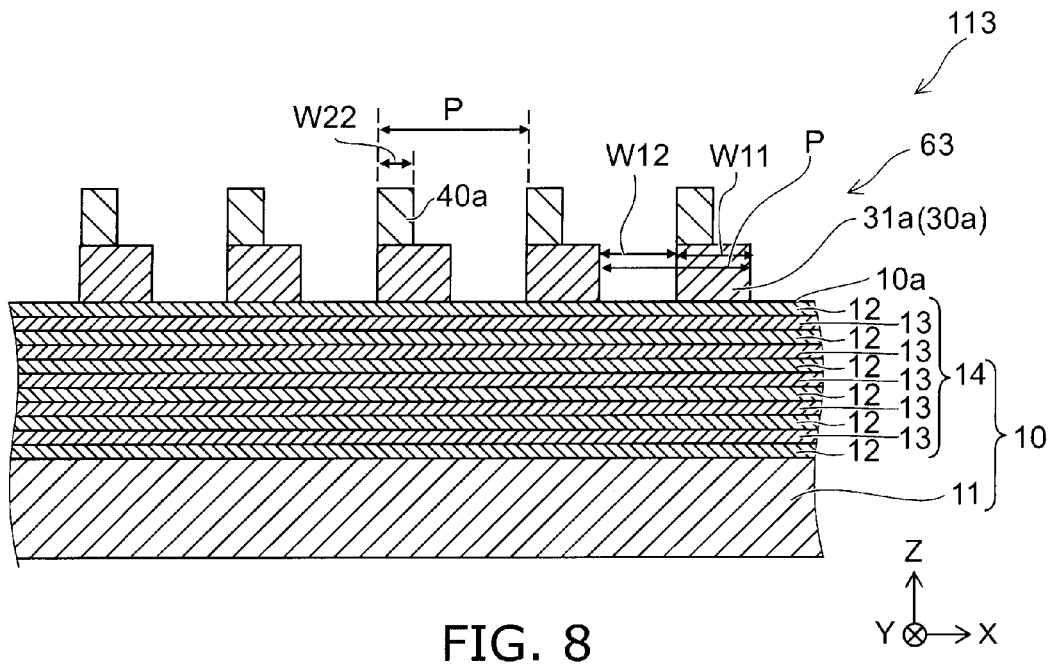
FIG. 8 is a schematic cross-sectional view illustrating the configuration of an alternative exposure apparatus inspection mask according to the first embodiment.

FIG. 8 is a schematic cross-sectional view illustrating the configuration of an alternative exposure apparatus inspection mask according to the first embodiment.

As shown in FIG. 8, the alternative exposure apparatus inspection mask 113 according to this embodiment also includes a substrate 10 and a first pattern portion 63. The first pattern portion 63 includes a first lower layer 30a including a first absorption layer 31a, and a first reflection layer 40a. In this example, the first lower layer 30a does not include a first lower reflection layer 32a.

In this example, each first reflection layer 40a is provided on the corresponding first absorption layer 31a (on the opposite side of the first absorption layer 31a from the substrate 10). Each first reflection layer 40a exposes part of the corresponding first absorption layer 31a.

The exposure apparatus inspection masks 111, 112, and 113 configured as above can also generate plus first order diffraction light and minus first order diffraction light being mutually different in diffraction efficiency, and can inspect an exposure apparatus using a reflection type photomask. Here, also in these exposure apparatus inspection masks 111, 112, and 113, the width W11 of the first absorption layer 31a, the width W12 between the plurality of first absorption layers 31a (e.g., the width along the X-axis direction of each of the plurality of first lower reflection layers 32a), and the width W22 of the first reflection layer 40a are arbitrary.

The exposure apparatus inspected by the exposure apparatus inspection masks 110, 111, 112, and 113 according to this embodiment uses EUV light having a wavelength of, for example, 13.5 nm as exposure light. Thus, the absorption coefficient in substances is high, unlike exposure using a deep ultra violet (DUV) light such as KrF and ArF as a light source. Hence, the exposure apparatus inspection masks 110, 111, 112, and 113 are used in a vacuum.

(Second Embodiment)

Figure 9:
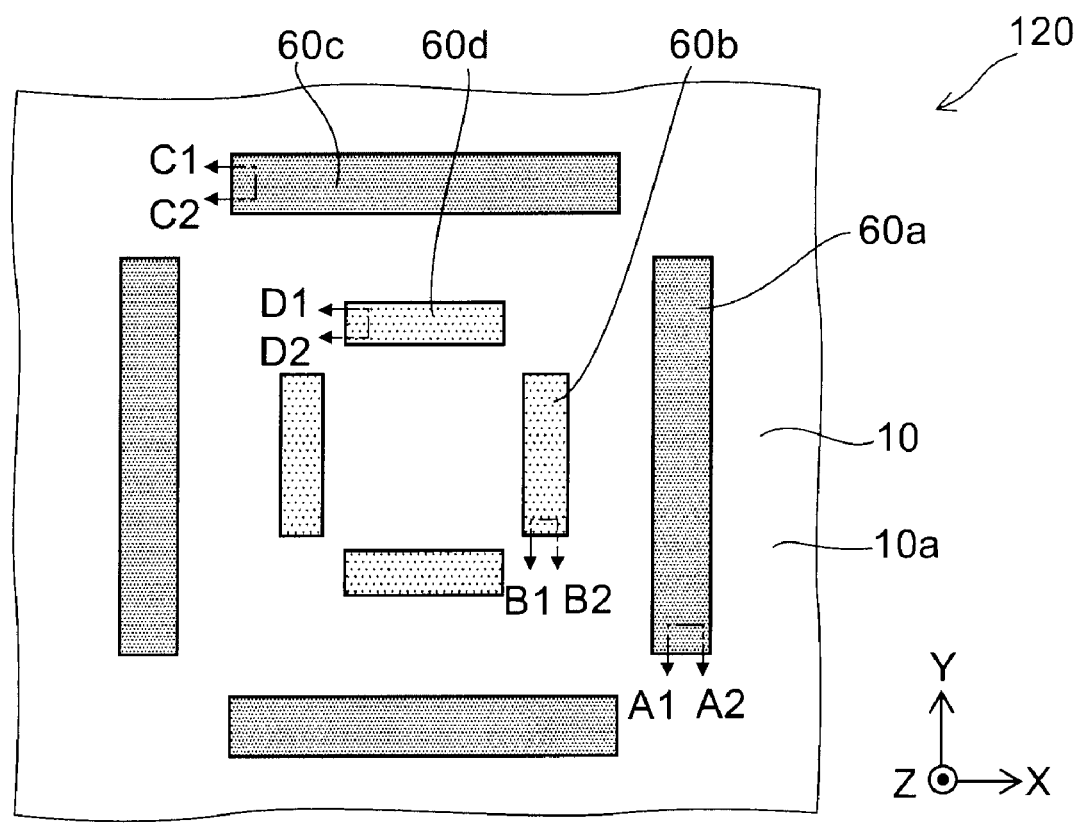
FIG. 9 is a schematic plan view illustrating the configuration of an exposure apparatus inspection mask according to a second embodiment.

FIG. 9 is a schematic plan view illustrating the configuration of an exposure apparatus inspection mask according to a second embodiment.

Figure 10A:
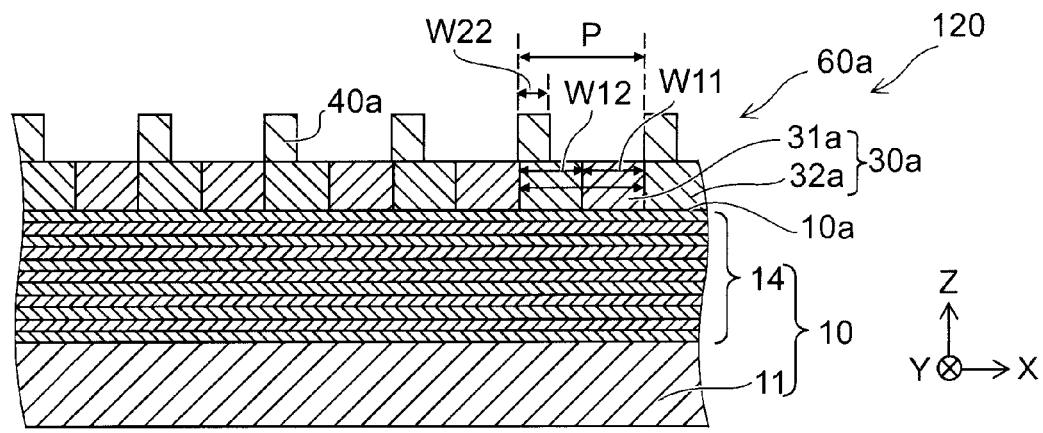
FIG. 10A and FIG. 10B are schematic cross-sectional views illustrating the configuration of the exposure apparatus inspection mask according to the second embodiment.
Figure 10B:
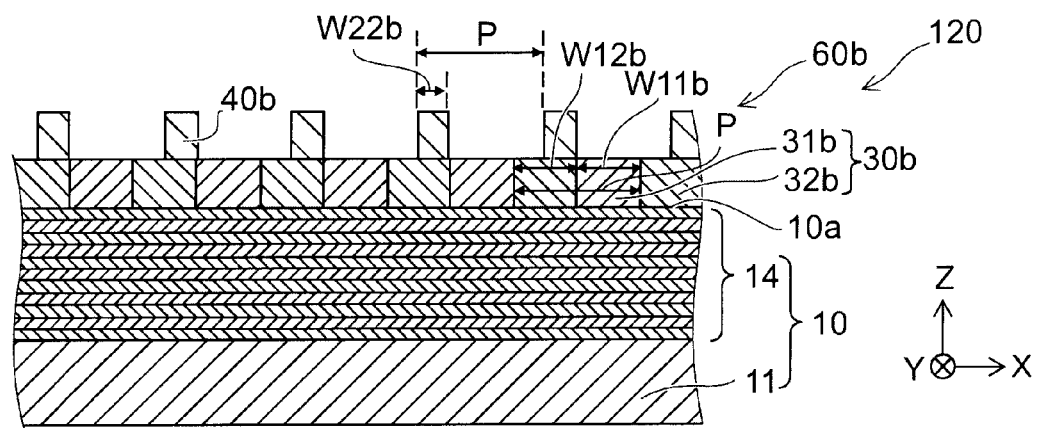

FIG. 10A and FIG. 10B are schematic cross-sectional views illustrating the configuration of the exposure apparatus inspection mask according to the second embodiment.

More specifically, FIG. 10A is a cross-sectional view taken along line A1-A2 of FIG. 9, and FIG. 10B is a cross-sectional view taken along line B1-B2 of FIG. 9.

Figure 11A:
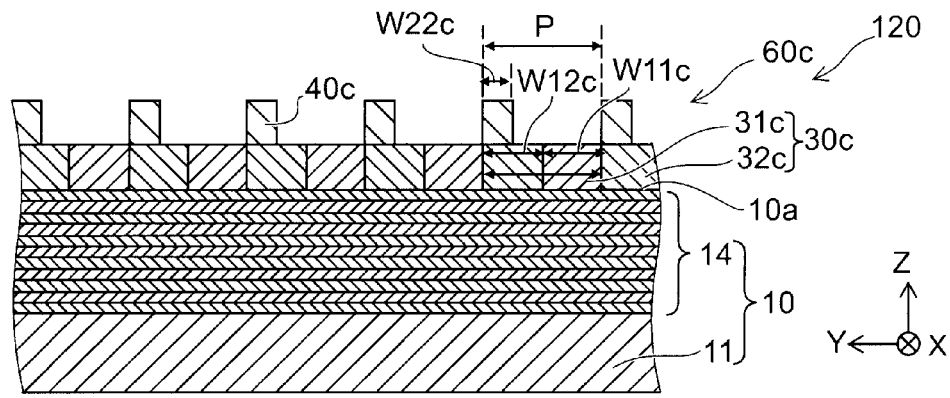
FIG. 11A and FIG. 11B are schematic cross-sectional views illustrating the configuration of the exposure apparatus inspection mask according to the second embodiment.
Figure 11B:
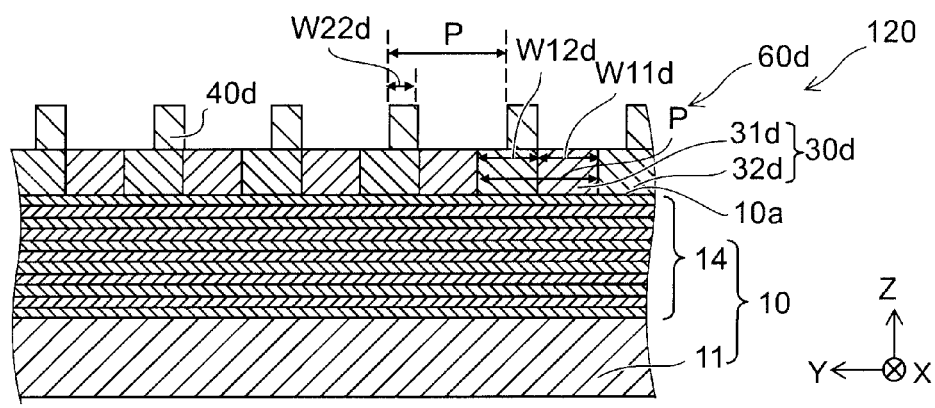

FIG. 11A and FIG. 11B are schematic cross-sectional views illustrating the configuration of the exposure apparatus inspection mask according to the second embodiment.

More specifically, FIG. 11A is a cross-sectional view taken along line C1-C2 of FIG. 9, and FIG. 11B is a cross-sectional view taken along line D1-D2 of FIG. 9.

As shown in FIG. 9, in addition to the first pattern portion 60a, the exposure apparatus inspection mask 120 according to this embodiment further includes a second pattern portion 60b provided on the major surface 10a of the substrate 10.

As shown in FIG. 10A, the first pattern portion 60a can be made similar to the first pattern portion 60a in the exposure apparatus inspection mask 110 described with reference to FIG. 1, and hence the description thereof is omitted.

As shown in FIG. 10B, the second pattern portion 60b includes a second lower layer 30b and a plurality of second reflection layers 40b.

The second lower layer 30b is provided on the major surface 10a. The second lower layer 30b includes a plurality of second absorption layers 31b periodically arranged at a pitch P along the X-axis direction and being absorptive to the exposure light.

The plurality of second reflection layers 40b are provided on the opposite side of the second lower layer 30b from the substrate 10. The plurality of second reflection layers 40b are periodically arranged at the pitch P along the X-axis direction. Each of the plurality of second reflection layers 40b exposes at least part of each of the plurality of second absorption layers 31b. The reflectance for the exposure light of the plurality of second reflection layers 40b is higher than the reflectance for the exposure light of the second absorption layer 31b.

In this example, the second lower layer 30b further includes a second lower reflection layer 32b provided between the plurality of second absorption layers 31b and having higher reflectance for the exposure light than the second absorption layer 31b.

As shown in FIG. 10A and FIG. 10B, the relative positional relationship along the X-axis direction between the first absorption layer 31a and the first reflection layer 40a and the relative positional relationship along the X-axis direction between the second absorption layer 31b and the second reflection layer 40b are mirror symmetric about the Y-axis direction (i.e., a direction parallel to the major surface 10a and perpendicular to the X-axis direction).

For example, the pitch P of the first absorption layers 31a and the pitch P of the second absorption layers 31b are substantially equal to each other. The width W11 of the first absorption layer 31a and the width W11b of the second absorption layer 31b are substantially equal to each other. The width W12 between the plurality of first absorption layers 31a and the width W12b between the plurality of second absorption layers 31b are substantially equal to each other. The width W22 of the first reflection layer 40a and the width W22b of the second reflection layer 40b are substantially equal to each other.

Here, for example, the thickness of the second absorption layer 31b is set equal to the thickness t11 of the first absorption layer 31a. The thickness of the second lower reflection layer 32b is set equal to the thickness t12 of the first lower reflection layer 32a. The thickness of the second reflection layer 40b is set equal to the thickness t22 of the first reflection layer 40a.

Furthermore, for example, the arrangement of the first reflection layer 40a relative to the first absorption layer 31a (the relative arrangement along the X-axis direction) is mirror symmetric about the Y-axis direction with respect to the arrangement of the second reflection layer 40b relative to the second absorption layer 31b (the relative arrangement along the X-axis direction).

By using the first pattern portion 60a and the second pattern portion 60b having such a relationship, the shift direction of the transferred pattern of the first pattern portion 60a on the water and the shift direction of the transferred pattern of the second pattern portion 60b on the water can be made opposite to each other in the case where the focus of the exposure apparatus is shifted, for example. That is, if the shift direction of the transferred pattern of the first pattern portion 60a on the water is the plus X1-axis direction, then the shift direction of the transferred pattern of the second pattern portion 60b on the water can be made opposite to the plus X1-axis direction, i.e., can be set to the minus X1-axis direction.

The optical characteristic of the second absorption layer 31b is set identical to the optical characteristic of the first absorption layer 31a. The material used for the second absorption layer 31b is identical to the material used for the first absorption layer 31a. Here, the second absorption layer 31b can be formed simultaneously and collectively with the first absorption layer 31a.

The optical characteristic of the second reflection layer 40b is set identical to the optical characteristic of the first reflection layer 40a. The material used for the second reflection layer 40b is identical to the material used for the first reflection layer 40a. Here, the second reflection layer 40b can be formed simultaneously and collectively with the first reflection layer 40a. The magnitude relationship between the reflectance of the major surface 10a of the substrate 10 and the reflectance of the second reflection layer 40b is identical to the magnitude relationship between the reflectance of the major surface 10a of the substrate 10 and the reflectance of the first reflection layer 40a.

The optical characteristic of the second lower reflection layer 32b is set identical to the optical characteristic of the first lower reflection layer 32a. The material used for the second lower reflection layer 32b is identical to the material used for the first lower reflection layer 32a. Here, the second lower reflection layer 32b can be formed simultaneously and collectively with the first lower reflection layer 32a.

By using a combination of the first pattern portion 60a and the second pattern portion 60b thus configured, the detection sensitivity can be doubled as compared with the case of using only the first pattern portion 60a, for example. Thus, more accurate inspection can be performed.

Here, a plurality of pairs of the first pattern portion 60a and the second pattern portion 60b can be provided on the major surface 10a of the substrate 10.

Furthermore, as shown in FIG. 9, the exposure apparatus inspection mask 120 further includes a third pattern portion 60c provided on the major surface 10a and a fourth pattern portion 60d provided on the major surface 10a.

As shown in FIG. 11A, the third pattern portion 60c includes a third lower layer 30c and a plurality of third reflection layers 40c.

The third lower layer 30c is provided on the major surface 10a. The third lower layer 30c includes a plurality of third absorption layers 31c periodically arranged at a pitch P along the Y-axis direction parallel to the major surface 10a and perpendicular to the X-axis direction, and being absorptive to the exposure light.

The plurality of third reflection layers 40c are provided on the opposite side of the third lower layer 30c from the substrate 10. The plurality of third reflection layers 40c are periodically arranged at the pitch P along the Y-axis direction. Each of the plurality of third reflection layers 40c exposes at least part of each of the plurality of third absorption layers 31c. The reflectance for the exposure light of the plurality of third reflection layers 40c is higher than the reflectance for the exposure light of the third absorption layer 31c.

In this example, the third lower layer 30c further includes a third lower reflection layer 32c provided between the plurality of third absorption layers 31c and having higher reflectance for the exposure light than the third absorption layer 31c.

As shown in FIG. 11B, the fourth pattern portion 60d includes a fourth lower layer 30d and a plurality of fourth reflection layers 40d.

The fourth lower layer 30d is provided on the major surface 10a. The fourth lower layer 30d includes a plurality of fourth absorption layers 31d periodically arranged at a pitch P along the Y-axis direction and being absorptive to the exposure light.

The plurality of fourth reflection layers 40d are provided on the opposite side of the fourth lower layer 30d from the substrate 10. The plurality of fourth reflection layers 40d are periodically arranged at the pitch P along the Y-axis direction. Each of the plurality of fourth reflection layers 40d exposes at least part of each of the plurality of fourth absorption layers 31d. The reflectance for the exposure light of the plurality of fourth reflection layers 40d is higher than the reflectance for the exposure light of the fourth absorption layer 31d.

In this example, the fourth lower layer 30d further includes a fourth lower reflection layer 32d provided between the plurality of fourth absorption layers 31d and having higher reflectance for the exposure light than the fourth absorption layer 31d.

As shown in FIG. 11A and FIG. 11B, the relative positional relationship along the Y-axis direction between the third absorption layer 31c and the third reflection layer 40c and the relative positional relationship along the Y-axis direction between the fourth absorption layer 31d and the fourth reflection layer 40d are mirror symmetric about the X-axis direction.

For example, the pitch P of the third absorption layers 31c and the pitch P of the fourth absorption layers 31d are substantially equal to each other. The width W11c of the third absorption layer 31c and the width W11d of the fourth absorption layer 31d are substantially equal to each other. The width W12c between the plurality of third absorption layers 31c and the width W12d between the plurality of fourth absorption layers 31d are substantially equal to each other. The width W22c of the third reflection layer 40c and the width W22d of the fourth reflection layer 40d are substantially equal to each other.

Here, for example, the thickness of the fourth absorption layer 31d is set equal to the thickness of the third absorption layer 31c, the thickness of the fourth lower reflection layer 32d is set equal to the thickness of the third lower reflection layer 32c, and the thickness of the fourth reflection layer 40d is set equal to the thickness of the third reflection layer 40c.

Furthermore, for example, the arrangement of the third reflection layer 40c relative to the third absorption layer 31c (the relative arrangement along the Y-axis direction) is mirror symmetric about the X-axis direction with respect to the arrangement of the fourth reflection layer 40d relative to the fourth absorption layer 31d (the relative arrangement along the Y-axis direction).

By using the third pattern portion 60c and the fourth pattern portion 60d having such a relationship, the shift direction of the transferred pattern of the third pattern portion 60c on the wafer and the shift direction of the transferred pattern of the fourth pattern portion 60d on the wafer can be made opposite to each other in the case where the focus of the exposure apparatus is shifted, for example.

The optical characteristics of the third absorption layer 31c and the fourth absorption layer 31d are set identical to the optical characteristics of the first absorption layer 31a and the second absorption layer 31b. The materials used for the third absorption layer 31c and the fourth absorption layer 31d are identical to the materials used for the first absorption layer 31a and the second absorption layer 31b. Here, the third absorption layer 31c and the fourth absorption layer 31d can be formed simultaneously and collectively with the first absorption layer 31a and the second absorption layer 31b.

The optical characteristics of the third reflection layer 40c and the fourth reflection layer 40d are set identical to the optical characteristics of the first reflection layer 40a and the second reflection layer 40b. The materials used for the third reflection layer 40c and the fourth reflection layer 40d are identical to the materials used for the first reflection layer 40a and the second reflection layer 40b. Here, the third reflection layer 40c and the fourth reflection layer 40d can be formed simultaneously and collectively with the first reflection layer 40a and the second reflection layer 40b.

The optical characteristics of the third lower reflection layer 32c and the fourth lower reflection layer 32d are set identical to the optical characteristics of the first lower reflection layer 32a and the second lower reflection layer 32b.

The materials used for the third lower reflection layer 32c and the fourth lower reflection layer 32d are identical to the material used for the first lower reflection layer 32a and the second lower reflection layer 32b. Here, the third lower reflection layer 32c and the fourth lower reflection layer 32d can be formed simultaneously and collectively with the first lower reflection layer 32a and the second lower reflection layer 32b.

By using a combination of the third pattern portion 60c and the fourth pattern portion 60d thus configured, the detection sensitivity can be doubled as compared with the case of using only the third pattern portion 60c, for example. Thus, more accurate inspection can be performed.

Here, a plurality of pairs of the third pattern portion 60c and the fourth pattern portion 60d can be provided on the major surface 10a of the substrate 10.

Figure 12:
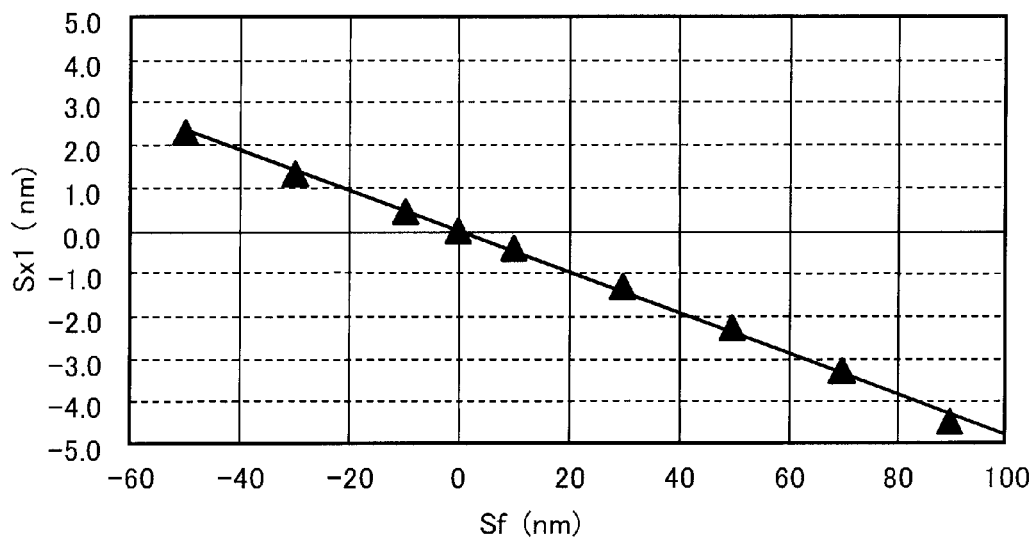
FIG. 12 is a graph illustrating characteristics of the exposure apparatus inspection mask according to the second embodiment.

FIG. 12 is a graph illustrating characteristics of the exposure apparatus inspection mask according to the second embodiment.

More specifically, FIG. 12 illustrates the results of simulating the shift amount, for example, along the X1-axis direction of the pattern transfer position 220 on the wafer when the focus position (e.g., the position along the Z1-axis direction) of the exposure apparatus is shifted in the inspection of the exposure apparatus using the exposure apparatus inspection mask 120. In FIG. 12, the horizontal axis represents the shift amount Sf of the focus position of the exposure apparatus, and the vertical axis represents the shift amount Sx1 along the X1-axis direction of the pattern transfer position 220 on the wafer.

In this simulation, the pitch P was 80 nm. The width W11 of the first absorption layer 31a was 40 nm. The width W12 between the plurality of first absorption layers 31a (in this example, the width along the X-axis direction of each of the plurality of first lower reflection layers 32a) was 40 nm. The width W22 of the first reflection layer 40a was 20 nm. The thickness t11 of the first absorption layer 31a was 61 nm. The thickness t12 of the first lower reflection layer 32a was equal to the thickness t11 of the first absorption layer 31a. The thickness t22 of the first reflection layer 40a was 61 nm.

As shown in FIG. 12, the shift amount Sx1 along the X1-axis direction of the pattern transfer position 220 on the wafer is proportional to the shift amount Sf of the focus position of the exposure apparatus. The relationship between the shift amount Sx1 and the shift amount Sf is sufficiently linear. For example, when the shift amount Sf of the focus position of the exposure apparatus is 100 nm, the absolute value of the shift amount Sx1 along the X1-axis direction of the pattern transfer position 220 on the wafer is 4.8 nm.

Thus, by using the exposure apparatus inspection mask 120 according to this embodiment, the pattern transfer position 220 on the wafer can be shifted in the X1-Y1 plane on the basis of the shift along the Z1-axis direction of the focus position. Furthermore, by measuring the shift of the pattern transfer position, the focus position of the exposure apparatus can be detected. That is, the focus characteristic of the exposure apparatus can be evaluated.

In the exposure apparatus inspection mask 120, the first pattern portion 60a includes the configuration illustrated in FIG. 1. However, the first pattern portion 60a of the exposure apparatus inspection mask 120 can includes the configuration of the first pattern portions 61, 62, and 63 illustrated in FIG. 6, FIG. 7, and FIG. 8. In this case, the second pattern portion 60b of the exposure apparatus inspection mask 120 is adapted to the configuration of the first pattern portions 61, 62, and 63, respectively. Furthermore, the third pattern portion 60c may also include the configuration of the first pattern portions 61, 62, and 63 illustrated in FIG. 6, FIG. 7, and FIG. 8. In this case, the fourth pattern portion 60d is adapted to the configuration of the first pattern portions 61, 62, and 63, respectively.

Figure 13:
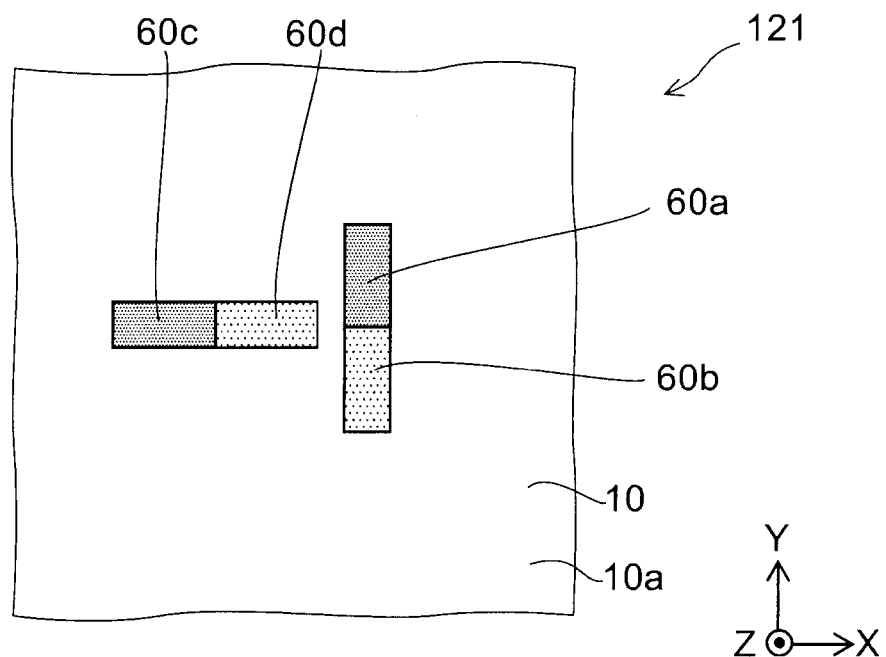
FIG. 13 is a schematic plan view illustrating the configuration of an alternative exposure apparatus inspection mask according to the second embodiment.

FIG. 13 is a schematic plan view illustrating the configuration of an alternative exposure apparatus inspection mask according to the second embodiment.

As shown in FIG. 13, an exposure apparatus inspection mask 121 according to this embodiment also includes a substrate 10, a first pattern portion 60a, a second pattern portion 60b, a third pattern portion 60c, and a fourth pattern portion 60d. The cross-sectional configuration of the first pattern portion 60a, the second pattern portion 60b, the third pattern portion 60c, and the fourth pattern portion 60d can be the configuration illustrated in FIG. 10A, FIG. 10B, FIG. 11A, and FIG. 11B, and hence the description thereof is omitted.

In the exposure apparatus inspection mask 121, the layout of the first pattern portion 60a, the second pattern portion 60b, the third pattern portion 60c, and the fourth pattern portion 60d in the major surface 10a is different from that in the exposure apparatus inspection mask 120.

More specifically, in the exposure apparatus inspection mask 120 illustrated in FIG. 9, the first pattern portion 60a and the second pattern portion 60b are arranged along the X-axis direction. Furthermore, in the exposure apparatus inspection mask 120, the third pattern portion 60c and the fourth pattern portion 60d are arranged along the Y-axis direction.

On the other hand, in the exposure apparatus inspection mask 121 illustrated in FIG. 13, the first pattern portion 60a and the second pattern portion 60b are arranged along the Y-axis direction. Furthermore, in the exposure apparatus inspection mask 121, the third pattern portion 60c and the fourth pattern portion 60d are arranged along the X-axis direction.

The exposure apparatus inspection mask 121 can also generate plus first order diffraction light and minus first order diffraction light being mutually different in diffraction efficiency, and can inspect an exposure apparatus using a reflection type photomask.

(Third Embodiment)

Figure 14:
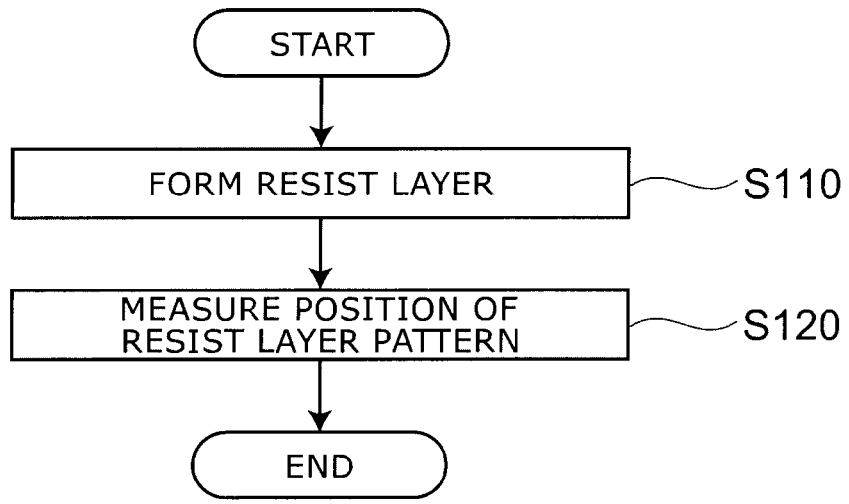
FIG. 14 is a flow chart illustrating an exposure apparatus inspection method according to a third embodiment.

FIG. 14 is a flow chart illustrating an exposure apparatus inspection method according to a third embodiment.

This inspection method is a method for inspecting an exposure apparatus using a reflection type photomask. The exposure apparatus to be inspected is, for example, an exposure apparatus using EUV light having a wavelength of 13.5 nm as exposure light. This inspection method uses an exposure apparatus inspection mask for generating plus first order diffraction light and minus first order diffraction light being mutually different in diffraction efficiency.

As shown in FIG. 14, in this inspection method, a resist film formed on a test wafer is irradiated with exposure light reflected by the exposure apparatus inspection mask according to the embodiments to form a resist layer having a pattern based on the pattern of the exposure apparatus inspection mask (step S110).

For example, a resist film formed on a test wafer is irradiated with exposure light reflected by the exposure apparatus inspection masks 110, 111, 112, 113, 120, and 121 described with reference to the first and second embodiments, and exposure apparatus inspection masks modified therefrom. Next, for example, development treatment is performed to form a resist layer having a pattern based on the pattern of the exposure apparatus inspection mask (e.g., the pattern of the first pattern portion 60a and the like).

Next, as shown in FIG. 14, the position of the pattern of the resist layer formed on the test wafer is measured (step S120). That is, for example, the position of the pattern of the resist layer corresponding to the pattern of the first pattern portion 60a is measured.

As described with reference to FIG. 2A, in the exposure apparatus inspection mask according to the embodiments, the plus first order diffraction light and the minus first order diffraction light are mutually different in diffraction efficiency. Hence, the position of the pattern of the resist layer is shifted in accordance with the shift of the focus position of the exposure apparatus. Thus, by measuring this position of the pattern of the resist layer, the focus characteristic of the exposure apparatus can be inspected.

As described with reference to the second embodiment, in the case of using a combination of the first pattern portion 60a and the second pattern portion 60b, the shift of the position of the pattern of the resist layer can be easily measured by measuring the relative position of the pattern of the resist layer corresponding to the pattern of the first pattern portion 60a and the pattern of the resist layer corresponding to the pattern of the second pattern portion 60b. In this case, the detection sensitivity can be doubled as compared with the case of using a single pattern portion. Thus, more accurate inspection can be performed.

Furthermore, by using a combination of the third pattern portion 60c and the fourth pattern portion 60d, the shift of the position of the pattern of the resist layer can be easily measured. The detection sensitivity can be doubled as compared with the case of using a single pattern portion. Thus, more accurate inspection can be performed.

Thus, the embodiments can provide an exposure apparatus inspection mask and an exposure apparatus inspection method for inspecting an exposure apparatus using a reflection type photomask.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in exposure apparatus inspection masks such as substrates, bases, stacked films, pattern portions, lower layers, absorption layers, reflection layers, and lower reflection layers, and the like from known art. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all exposure apparatus inspection masks and exposure apparatus inspection methods practicable by an appropriate design modification by one skilled in the art based on the exposure apparatus inspection masks and the exposure apparatus inspection methods described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention. For example, additions, deletions, or design modifications of components or additions, omissions, or condition modifications of processes appropriately made by one skilled in the art in regard to the exemplary embodiments described above are within the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. An exposure apparatus inspection mask comprising:
a substrate having a major surface reflective to an exposure light; and
a first pattern portion provided on the major surface, the first pattern portion including:
  a first lower layer provided on the major surface and including a plurality of first absorption layers periodically arranged at a prescribed pitch along a first direction parallel to the major surface and being absorptive to the exposure light; and
  a plurality of first reflection layers provided on a side of the first lower layer opposite to the substrate, the plurality of first reflection layers being periodically arranged at the pitch along the first direction, exposing at least part of each of the plurality of first absorption layers, and having a reflectance for the exposure light higher than a reflectance for the exposure light of the first absorption layers.

2. The mask according to claim 1, wherein the first lower layer further includes a plurality of first lower reflection layers provided between the plurality of first absorption layers and having a reflectance for the exposure light higher than a reflectance for the exposure light of the first absorption layers.

3. The mask according to claim 2, wherein the first absorption layers include tantalum, the first lower reflection layers include silicon, and the first reflection layers include silicon.

4. The mask according to claim 1, wherein the pitch is not less than $\lambda/\{LNA\times(1-\sigma)\}$ and not more than $2\times\lambda/\{LNA\times(1+\sigma)\}$, where $\lambda$ is a wavelength of the exposure light, LNA is numerical aperture of a projection optical system of an exposure apparatus to be inspected, and $\sigma$ is a value of numerical aperture of an illumination optical system of the exposure apparatus divided by the numerical aperture of the projection optical system.

5. The mask according to claim 1, wherein a width along the first direction of each of the plurality of first absorption layers is substantially equal to a space between the plurality of first absorption layers.

6. The mask according to claim 1, wherein a width along the first direction of each of the plurality of first reflection layers is smaller than a width along the first direction of each of the plurality of first absorption layers.

7. The mask according to claim 1, wherein a width along the first direction of each of the plurality of first reflection layers is smaller than a width along the first direction between the plurality of first absorption layers.

8. The mask according to claim 1, further comprising
a second pattern portion provided on the major surface, the second pattern portion including:
  a second lower layer provided on the major surface and including a plurality of second absorption layers periodically arranged at the pitch along the first direction and being absorptive to the exposure light; and
  a plurality of second reflection layers provided on a side of the second lower layer opposite to the substrate, the plurality of second reflection layers being periodically arranged at the pitch along the first direction, exposing at least part of each of the plurality of second absorption layers, and having a reflectance for the exposure light higher than a reflectance for the exposure light of the second absorption layers,
a relative positional relationship along the first direction between the first absorption layers and the first reflection layers and a relative positional relationship along the first direction between the second absorption layers and the second reflection layers being mirror symmetric about a second direction parallel to the major surface and perpendicular to the first direction.

9. The mask according to claim 8, wherein
an optical characteristic including at least one of refractive index for the exposure light, reflectance for the exposure light, and absorptance for the exposure light of the second absorption layers is identical to an optical characteristic including at least one of refractive index for the exposure light, reflectance for the exposure light, and absorptance for the exposure light of the first absorption layers, and
an optical characteristic including at least one of refractive index for the exposure light, reflectance for the exposure light, and absorptance for the exposure light of the second reflection layers is identical to an optical characteristic including at least one of refractive index for the exposure light, reflectance for the exposure light, and absorptance for the exposure light of the first reflection layers.

10. The mask according to claim 8, wherein
a material used for the second absorption layers is identical to a material used for the first absorption layers, and
a material used for the second reflection layers is identical to a material used for the first reflection layers.

11. The mask according to claim 8, wherein the second lower layer further includes a plurality of second lower reflection layers provided between the plurality of second absorption layers and having a reflectance for the exposure light higher than a reflectance for the exposure light of the second absorption layers.

12. The mask according to claim 11, wherein an optical characteristic including at least one of refractive index for the exposure light, reflectance for the exposure light, and absorptance for the exposure light of the second lower reflection layers is identical to an optical characteristic including at least one of refractive index for the exposure light, reflectance for the exposure light, and absorptance for the exposure light of the first lower reflection layers.

13. The mask according to claim 11, wherein a material used for the second lower reflection layers is identical to a material used for the first lower reflection layers.

14. The mask according to claim 8, further comprising:
a third pattern portion provided on the major surface; and
a fourth pattern portion provided on the major surface,
the third pattern portion including:
a third lower layer provided on the major surface and including a plurality of third absorption layers periodically arranged at the pitch along the second direction parallel to the major surface and perpendicular to the first direction and being absorptive to the exposure light; and
a plurality of third reflection layers provided on a side of the third lower layer opposite to the substrate, the plurality of third reflection layers being periodically arranged at the pitch along the second direction, exposing at least part of each of the plurality of third absorption layers, and having a reflectance for the exposure light higher than a reflectance for the exposure light of the third absorption layers, the fourth pattern portion including:
a fourth lower layer provided on the major surface and including a plurality of fourth absorption layers periodically arranged at the pitch along the second direction and being absorptive to the exposure light; and
a plurality of fourth reflection layers provided on a side of the fourth lower layer opposite to the substrate, the plurality of fourth reflection layers being periodically arranged at the pitch along the second direction, exposing at least part of each of the plurality of fourth absorption layers, and having a reflectance for the exposure light higher than a reflectance for the exposure light of the fourth absorption layers,
a relative positional relationship along the second direction between the third absorption layers and the third reflection layers and a relative positional relationship along the second direction between the fourth absorption layers and the fourth reflection layers being mirror symmetric about the first direction.

15. The mask according to claim 1, wherein the first absorption layers include tantalum, and the first reflection layers include silicon.

16. The mask according to claim 1, wherein the exposure apparatus inspection mask generates a plus first order diffraction light and a minus first order diffraction light, the plus first order diffraction light has a diffraction efficiency different from a diffraction efficiency of the minus first order diffraction light.

17. The mask according to claim 1, wherein the substrate includes a plurality of first layers and a second layer, the plurality of first layers being stacked in a direction perpendicular to the major surface, the second layer being provided between the plurality of first layers and having an optical characteristic for the exposure light different from an optical characteristic for the exposure light of the first layers.

18. The mask according to claim 17, wherein one of the first layers and the second layer includes silicon, and the other of the first layers and the second layer includes molybdenum.

* * * * *